US006187502B1

(12) United States Patent
Chapman et al.

(10) Patent No.: US 6,187,502 B1
(45) Date of Patent: Feb. 13, 2001

(54) STABILIZER FOR INFRARED-ABSORBING CYANINE COLORANT FOR LASER-COLORANT TRANSFER

(75) Inventors: Derek D. Chapman; Richard C. Van Hanehem, both of Rochester, NY (US)

(73) Assignee: Eastman Kodak Company, Rochester, NY (US)

( * ) Notice: Under 35 U.S.C. 154(b), the term of this patent shall be extended for 0 days.

(21) Appl. No.: 09/493,977

(22) Filed: Jan. 28, 2000

(51) Int. Cl.[7] .............................. G03C 1/73; G03C 5/16; G03C 8/10; G03F 7/34

(52) U.S. Cl. ......................... 430/201; 430/338; 430/944; 430/964; 8/471

(58) Field of Search .................................... 430/201, 944, 430/964, 338; 8/471

(56) References Cited

U.S. PATENT DOCUMENTS 5,972,838 10/1999 Pearce et al. ............................ 8/471

*Primary Examiner*—Richard L. Schilling
(74) *Attorney, Agent, or Firm*—Harold E. Cole

(57) ABSTRACT

A colorant-donor element for laser thermal transfer comprising a support having thereon a colorant layer comprising a colorant dispersed in a binder the colorant layer having associated therewith an infrared-absorbing cyanine colorant having a sulfonic acid group, the cyanine colorant having the following formula:

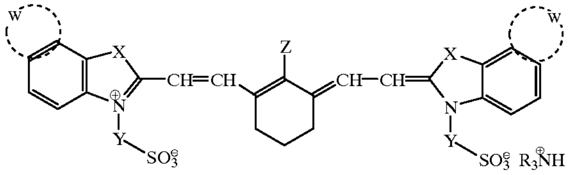

wherein:

each W independently represents the atoms necessary to form an optional 6-membered aromatic ring;

each X independently represents sulfur or $C(CH_3)_2$;

each Y independently represents an alkylene group having from about 2 to about 5 carbon atoms;

Z is chlorine or an alkylsulfonyl group having from 1 to about 4 carbon atoms; and each R independently represents an alkyl group having from 1 to about 6 carbon atoms; and said colorant layer also containing a stabilizer comprising a phenoxy resin, a copolymer of vinyl chloride/vinyl acetate/maleic anhydride or a copolymer of styrene/4-vinylpyridine.

20 Claims, No Drawings

STABILIZER FOR INFRARED-ABSORBING CYANINE COLORANT FOR LASER-COLORANT TRANSFER

FIELD OF THE INVENTION

This invention relates to a stabilizer for all infrared-absorbing cyanine colorant used in laser-colorant transfer donor elements. In particular, the infrared colorants are useful in laser colorant-transfer systems designed for digital color halftone proofing.

BACKGROUND OF THE INVENTION

In order to approximate the appearance of continuous-tone (photographic) images via ink-on-paper printing, the commercial printing industry relies on a process known as halftone printing. In halftone printing, color density gradations are produced by printing patterns of dots or areas of varying sizes, but of the same color density, instead of varying the color density continuously as is done in photographic printing.

There is an important commercial need to obtain a color proof image before a printing press run is made. It is desired that the color proof will accurately represent at least the details and color tone scale of the prints obtained on the printing press. In many cases, it is also desirable that the color proof accurately represent the image quality and halftone pattern of the prints obtained on the printing press. In the sequence of operations necessary to produce an ink-printed, full-color picture, a proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, full-color picture is assembled.

Colorants that are used in the printing industry are insoluble pigments. By virtue of their pigment character, the spectrophotometric curves of the printing inks are often unusually sharp on either the bathochromic or hypsochromic side. This can cause problems in color proofing systems in which colorants, as opposed to pigments, are being used. It is very difficult to match the hue of a given ink using a single colorant.

In U.S. Pat. No. 5,126,760, a process is described for producing a direct digital, halftone color proof of an original image on a colorant-receiving element. The proof can then be used to represent a printed color image obtained from a printing press. The process described therein comprises:

a) generating a set of electrical signals which is representative of the shape and color scale of an original image;

b) contacting a colorant-donor element comprising a support having thereon a colorant layer and an infrared-absorbing material with a first colorant-receiving element comprising a support having thereon a polymeric, colorant image-receiving layer;

c) using the signals to imagewise-heat by means of a diode laser the colorant-donor element, thereby transferring a colorant image to the first colorant-receiving element; and d) retransferring the colorant image to a second colorant image-receiving element which has the same substrate as the printed color image.

In the above process, multiple colorant-donors arc used to obtain a complete range of colors in the proof. For example, for a full-color proof, four colors: cyan, magenta, yellow and black are normally used.

By using the above process, the image colorant is transferred by heating the colorant-donor containing the infrared-absorbing material with the diode laser to volatilize the colorant, the diode laser beam being modulated by the set of signals which is representative of the shape and color of the original image, so that the colorant is heated to cause volatilization only in those areas in which its presence is required on the colorant-receiving layer to reconstruct the original image.

In color proofing in the printing industry, it is important to be able to match the proofing ink references provided by the International Prepress Proofing Association. These ink references are density patches made with standard 4-color process inks and are known as SWOP® (Specifications Web Offset Publications) Color Aims. For additional information on color measurement of inks for web offset proofing, see "Advances in Printing Science and Technology", Proceedings of the 19th International Conference of Printing Research Institutes, Eisenstadt, Austria, June 1987, J. T. Ling and R. Warner, p.55.

Infrared absorbing colorants are used in colorant-donor elements for laser-colorant transfer for the purpose of absorbing the laser energy and converting the radiant energy into thermal energy in order to cause colorant transfer to a receiver element. One problem encountered in the use of infrared colorants is that these colorants often exhibit some absorption in the visible spectrum. In the event that some or all of the infrared colorant is transferred along with the colorant, this absorption may spoil the color purity or hue of the transferred image colorant.

U.S. Pat. No. 5,972,838 discloses infrared absorbing dyes for laser colorant transfer. However, there is a problem in using these dyes under conditions of high humidity. When the dye-donor element is placed in a chamber at 38° C./90% RH and kept under these conditions for 48 hours, the absorption at 810 nm decreases by 30–40%. This has been caused by a shift in the absorption of the IR dye to shorter wavelength probably due to aggregation. The dye is not being destroyed as it can be shown by HPLC analysis that most of the dye is still present.

It is an object of this invention to provide a colorant-donor element for laser-induced thermal colorant transfer containing a stabilizer which is useful under high humidity keeping conditions in maintaining maximum absorptivity of the infrared-absorbing cyanine colorant at the wavelength of the laser emission.

SUMMARY OF THE INVENTION

This and other objects are obtained by this invention which relates to a colorant-donor element for laser thermal transfer comprising a support having thereon a colorant layer comprising a colorant dispersed in a binder, the colorant layer having associated therewith an infrared-absorbing cyanine colorant having at least two sulfonic acid groups, the cyanine colorant having the following formula:

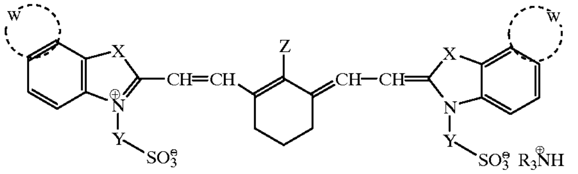

wherein:

each W independently represents the atoms necessary to form an optional 6-membered aromatic ring;

each X independently represents sulfur or $C(CH_3)_2$;

each Y independently represents an alkylene group having from about 2 to about 5 carbon atoms;

Z is chlorine or an alkylsulfonyl group having from 1 to about 4 carbon atoms; and each R independently represents al alkyl group having from 1 to about 6 carbon atoms; and said colorant layer also containing a stabilizer comprising a phenoxy resin, a copolymer of vinyl chloride/vinyl acetate/maleic anhydride or a copolymer of styrene/4-vinylpyridine.

By use of the invention, maximum absorptivity of the infrared-absorbing cyanine colorant at the wavelength of the laser emission is maintained under high humidity keeping conditions.

DESCRIPTION OF THE PREFERRED EMBODIMENTS

As noted above, the stabilizers which may be used in the invention include a phenoxy resin, a copolymer of vinyl chloride/vinyl acetate/maleic anhydride or a copolymer of styrene/4-vinylpyridine. Phenoxy resins useful in the invention include PKHH® supplied by Phenoxy Specialties.

In a preferred embodiment of the invention, the stabilizer is present in an amount of from about 0.02 g/m$^2$ to about 0.1 g/m$^2$, preferably from about 0.025 g/m$^2$ to about 0.05 g/m$^2$. In another preferred embodiment of the invention, the stabilizer is a phenoxy resin.

In a preferred embodiment of the invention, R is n-butyl in order to enhance the solubility of the cyanine colorant in organic solvents and in the coated polymer-colorant complex.

Examples of sulfonic acid-containing cyanine IR colorants useful in the invention include amine salts of the following:

IR-1

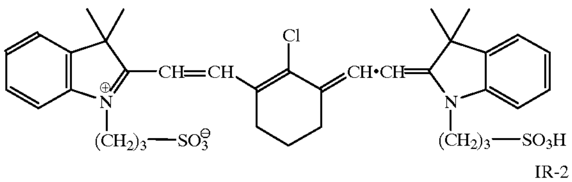

IR-2

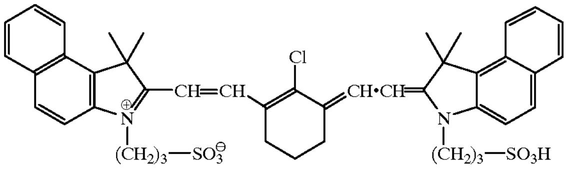

-continued

IR-3

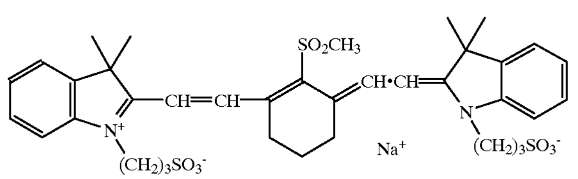

IR-4

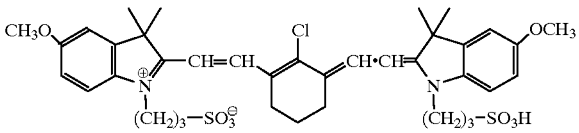

IR-5

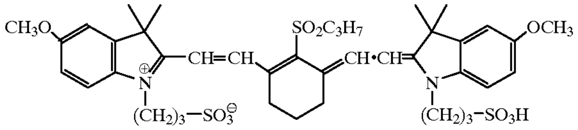

IR-6

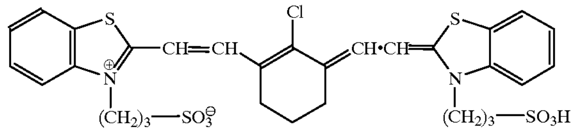

IR-7

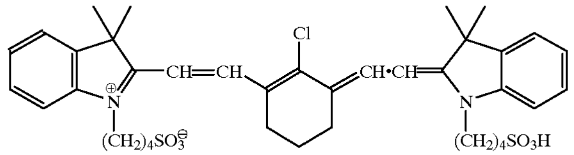

IR-8

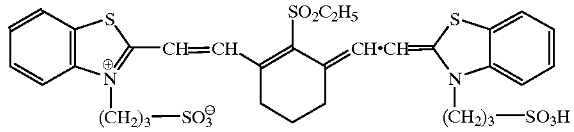

IR-9

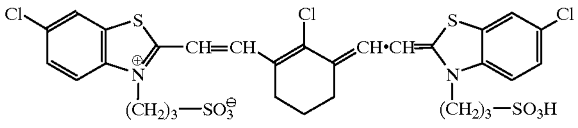

The donor elements may optionally contain between the image colorant or pigment bearing layer and the support a sub or barrier sub such as those disclosed in U.S. Pat. Nos. 4,695,288 and 4,737,486 and may include layers formed from organo-titanates, silicates, or aluminates, and the like. Preferably, a layer formed from tetrabutyltitanate is used, available commercially as Tyzor TBT® (Du Pont Corp.).

Colorants useful in the invention include both pigments and dyes. Pigments which can be used in the invention include the following: organic pigments such as metal phthalocyanines, e.g., copper phthalocyanine, quinacridones, epindolidiones, Rubine F6B (C.I. No. Pigment 184); Cromophthal® Yellow 3G (C.I. No. Pigment Yellow 93); Hostaperm® Yellow 3G (C.I. No. Pigment Yellow 154); Monastral® Violet R (C.I. No. Pigment Violet 19); 2,9-dimethylquinacridone (C.I. No. Pigment Red 122);

Indofast® Brilliant Scarlet R6300 (C.I. No. Pigment Red 123); Quindo Magenta RV 6803; Monstral® Blue G (C.I. No. Pigment Blue 15); Monstral® Blue BT 383D (C.I. No. Pigment Blue 15); Monstral® Blue G Br 284D (C.I. No. Pigment Blue 15); Monstral® Green CT 751 D (C.I. No. Pigment Green 7) or any of the materials disclosed in U.S. Pat. Nos. 5,171,650, 5,672,458 or 5,516,622, the disclosures of which are hereby incorporated by reference.

Dyes useful in the invention include the following: Anthraquinone dyes. e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM®. and KST Black 146® (products of Nippon Kayaku Co., Ltd.); azo dyes such as Kayalon Polyol Brilliant Blue BM®, Kayalon Polyol Dark Blue 2BM®, and KST Black KR® (products of Nippon Kayaku Co., Ltd.), Sumikaron Diazo Black 5G® (product of Sumitomo Chemical Co., Ltd.), and Miktazol Black 5GH® (product of Mitsui Toatsu Chemicals, Inc.); direct dyes such as Direct Dark Green B® (product of Mitsubishi Chemical Industries, Ltd.) and Direct Brown M® and Direct Fast Black D® (products of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite Green® (product of Hodogaya Chemical Co., Ltd.); or any of the dyes disclosed in U.S. Pat. Nos. 4,541,830; 4,698,651; 4,695,287; 4,701,439; 4,757, 046; 4,743,582; 4,769,360 and 4,753,922, the disclosures of which are hereby incorporated by reference. The above dyes may be employed singly or in combination. Combinations of pigments and/or dyes can also be used.

The colorants used in the invention may be employed at a coverage of from about 0.02 to about 1 g/$m^2$.

The process of obtaining an image with the colorant or pigment transfer donor elements of this invention has been described in U.S. Pat. No. 5,126,760 and is conveniently obtained on commercially available laser thermal proofing systems Such as the Kodak Approval® system, or the Creo Trendsetter® Spectrum system. Typically, a receiver sheet is placed on a rotating drum followed by successive placements of the individual cyan, magenta, yellow and black donor elements whereby the image for each color is transferred by image-wise exposure of the laser beam through the backside of the donor element.

The colorants in the colorant-donor of the invention are dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; polyvinyl butyrate; copolymers of maleic anhydride with vinyl ethers such as methyl vinyl ether; polycyanoacrylates; a polycarbonate; poly(vinyl acetate); poly(styrene-co-acrylonitrile); a polysulfone or a poly(phenylene oxide). The binder may be used at a coverage of from about 0.1 to about 5 g/$m^2$. Some of the above-described stabilizers may also function as a binder so that a separate binder may not be necessary.

The colorant layer of the colorant-donor element may be coated on the support or printed thereon by a printing technique such as a gravure process.

Any material can be used as the support for the colorant-donor element of the invention provided it is dimensionally stable and can withstand the heat of the laser. Such materials include polyesters such as poly(ethylene terephthalate); polyamides; polycarbonates; cellulose esters such as cellulose acetate; fluorine polymers such as poly(vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 $\mu$m.

The receiving element that is used with the donor element of the invention usually comprises a support having thereon a colorant image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the colorant-receiving element may also be reflective such as baryta-coated paper, polyethylene-coated paper, an ivory paper, a condenser paper or a synthetic paper such as DuPont Tyvek®. Pigmented supports such as white polyester (transparent polyester with white pigment incorporated therein) may also be used.

The image-receiving layer may comprise, for example, a polycarbonate, a polyurethane, a polyester, poly(vinyl chloride), poly(styrene-co-acrylonitrile), polycaprolactone, a poly(vinyl acetal) such as poly(vinyl alcohol-co-butyral), poly(vinyl alcohol-co-benzal), poly(vinyl alcohol-co-acetal) or mixtures thereof. The image-receiving layer may be present in any amount which is effective for the intended purpose. In general, good results have been obtained at a concentration of from about 1 to about 5 g/$m^2$.

As noted above, the donor elements of the invention are used to form a colorant transfer image. Such a process comprises imagewise-heating by means of a laser a colorant-donor element as described above and transferring a colorant image to a receiving element to form the colorant transfer image.

The colorant-donor element of the invention may be used in sheet form or in a continuous roll or ribbon. If a continuous roll or ribbon is employed, it may have only the colorants thereon as described above or may have alternating areas of other different colorants or pigments or combinations, such as sublimable cyan and/or yellow and/or black or other colorants. Such colorants are disclosed in U.S. Pat. No. 4,541,830, the disclosure of which is hereby incorporated by reference. Thus, one-, two-, three- or four-color elements (or higher numbers also) are included within the scope of the invention.

A laser is used to transfer colorant from the colorant-donor elements of the invention. It is preferred to use a diode laser since it offers substantial advantages in terms of its small size, low cost, stability, reliability, ruggedness, and ease of modulation Lasers which can be used to transfer colorant from donors employed in the invention are available commercially. There can be employed, for example, Laser Model SDL-2420-F12 from Spectra Diode Labs, or Laser Model SLD 304 V/W from Sony Corp.

A thermal printer which uses the laser described above to form an image on a thermal print medium is described and claimed in U.S. Pat. No. 5,268,708, the disclosure of which is hereby incorporated by reference.

Spacer beads may be employed in a separate layer over the colorant layer of the colorant-donor in the above-described laser process in order to separate the donor from the receiver during colorant transfer, thereby increasing the uniformity and density of the transferred image. That invention is more fully described in U.S. Pat. No. 4,772,582, the disclosure of which is hereby incorporated by reference. Alternatively, the spacer beads may be employed in the receiving layer of the receiver as described in U.S. Pat. No. 4,876,235, the disclosure of which is hereby incorporated by reference. The spacer beads may be coated with a polymeric binder if desired.

The use of an intermediate receiver with subsequent retransfer to a second receiving element may also be employed in the invention as described in U.S. Pat. No. 5,126,760. A multitude of different substrates can be used to prepare the color proof (the second receiver) which is preferably the same substrate as that used for the printing press run. Thus, this one intermediate receiver can be optimized for efficient colorant uptake without colorant-smearing or crystallization.

Optionally, the paper may be pre-laminated or pre-coated with an image receiving or colorant barrier layer in a dual-laminate process such as that described in U.S. Pat. No. 5,053,381. In addition, the receiver sheet may be an actual paper proofing stock or a simulation thereof with an optional laminate overcoat to protect the final image.

Examples of substrates which may be used for the second receiving element (color proof) include the following: Flo Kote Cover® (S. D. Warren Co.), Champion Textweb® (Champion Paper Co.), Quintessence Gloss® (Potlatch Inc.), Vintage Gloss® (Potlatch Inc.), Khrome Kote® (Champion Paper Co.), Consolith Gloss® (Consolidated Papers Co.), Ad-Proof Paper® (Appleton Papers, Inc.) and Mountie Matte® (Potlatch Inc.).

As noted above, after the colorant image is obtained on a first colorant-receiving element, it may be retransferred to a second colorant image-receiving element. This can be accomplished, for example, by passing the two receivers between a pair of heated rollers. Other methods of retransferring the colorant image could also be used such as using a heated platen, use of pressure and heat, external heating, etc.

Also as noted above, in making a color proof, a set of electrical signals is generated which is representative of the shape and color of an original image. This can be done, for example, by scanning an original image, filtering the image to separate it into the desired additive primary colors, i.e., red, blue and green, and then converting the light energy into electrical energy. The electrical signals are then modified by computer to form the color separation data which are used to form a halftone color proof. Instead of scanning an original object to obtain the electrical signals, the signals may also be generated by computer. This process is described more fully in *Graphic Arts Manual,* Janet Field ed., Arno Press, New York 1980 (p. 358ff), the disclosure of which is hereby incorporated by reference.

A thermal colorant transfer assemblage of the invention comprises a) a colorant-donor element as described above, and b) a colorant-receiving element as described above, the colorant-receiving element being in a superposed relationship with the colorant-donor element so that the colorant layer of the donor element is in contact with the colorant image-receiving layer of the receiving element.

The above assemblage comprising these two elements may be preassembled as an integral unit when a monochrome image is to be obtained. This may be done by temporarily adhering the two elements together at their margins. After transfer, the colorant-receiving element is then peeled apart to reveal the colorant transfer image.

When a three-color image is to be obtained, the above assemblage is formed three times using different colorant-donor elements. After the first colorant is transferred, the elements are peeled apart. A second colorant-donor element (or another area of the donor element with a different colorant area) is then brought in register with the colorant-receiving element and the process repeated. The third color is obtained in the same manner. A four color image may also be obtained using the colorant-donor element of the invention.

The following examples are provided to illustrate the invention.

EXAMPLES

Example 1

The following dyes were employed in this example:

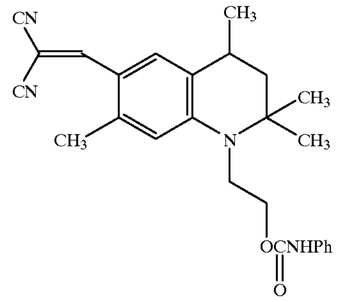

Yellow Dye A

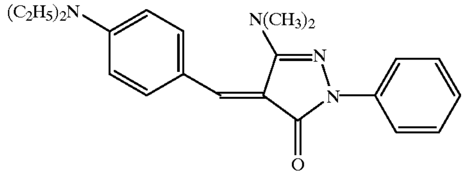

Yellow Dye B

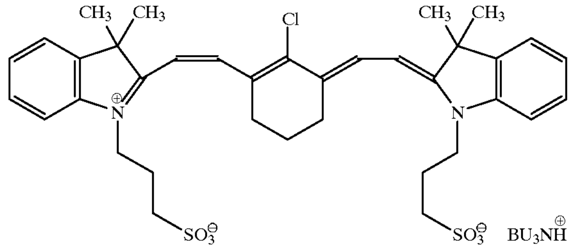

Cyanine Dye C
(U.S. Pat. No. 5,972,838)
(tributylammonium salt of IR-1)

Control Element 1

On a 100 μm poly(ethylene terephthalate) support was coated a dye layer containing Yellow Dye A illustrated above, 0.072g/$m^2$; Yellow Dye B illustrated above, 0.013 g/$m^2$; and Cyanine Dye C, 0.027 g/$m^2$, in a cellulose acetate propionate binder (CAP 480-20 from Eastman Chemical Company), 0.16 g/$m^2$, from a solvent mixture of diethyl ketone and 1-methoxy-2-propanol (55/45 wt./wt).

Control Element 2

This element was the same as Control Element 1 except that it also contained polyvinylpyridine at 0.027 g/$m^2$.

Control Element 3

This element was the same as Control Element 1 except that it also contained polyvinylpyrrolidone at 0.027 g/$m^2$.

Control Element 4

This element was the same as Control Element 1 except that it also contained Chlorowax 40 (Occidental Chemical Corp.) at 0.027 g/$m^2$.

Control Element 5

This element was the same as Control Element 1 except that it also contained poly N,N-dimethyl acrylamide at 0.027 g/$m^2$.

Element 1 of the Invention

This element was the same as Control Element 1 except that it also contained phenoxy resin PKHH®, Phenoxy Specialties, at 0.027 g/$m^2$.

Element 2 of the Invention

This element was the same as Control Element 1 except that it also contained a co-polymer of vinyl chloride/vinyl acetate/maleic anhydride at 0.027 g/$m^2$.

Element 3 of the Invention

This element was the same as Control Element 1 except that it also contained a co-polymer of styrene/4-vinylpyridine 50/50 at 0.027 g/$m^2$.

Testing

The transmission spectrum between 400 and 1000 nm of the above elements was recorded on a Hewlett-Packard Diode Array Spectrophotometer 8453 before and after being incubated in a chamber maintained at 38° C./90% RH for 20 hours. The percent loss in absorption at 802 nm (λmax of the dye) was calculated and shown in the following Table 1. A lower value of loss of dye is preferred.

TABLE 1

| Element | % Loss |
|---|---|
| Control 1 | 36 |
| Control 2 | 50 |
| Control 3 | 53 |
| Control 4 | 42 |
| Control 5 | 38 |
| 1 | 21 |
| 2 | 26 |
| 3 | 28 |

The above results show that the Elements 1–3 containing the stabilizers used in the invention had a lower % of dye loss than the Control Elements 1–5.

Example 2

Element 4 of the Invention

This was the same as Element 1 except that the amount of PKHH was 0.054 g/$m^2$.

Element 5 of the Invention

This was the same as Element 2 except that the amount of copolymer was 0.054 g/$m^2$.

Element 6 of the Invention

This was the same as Element 3 except that the amount of copolymer was 0.054 g/$m^2$.

Testing

The elements and Control 1 were tested as in Example 1 except that the elements were incubated for 96 hours. The following results were obtained:

TABLE 2

| Element | % Loss |
|---|---|
| Control 1 | 47 |
| 4 | 24 |
| 5 | 34 |
| 6 | 37 |

The above results show that the Elements 4–6 containing the stabilizers used in the invention had a lower % of dye loss than the Control Element 1.

Example 3

The following dyes were employed in this example:

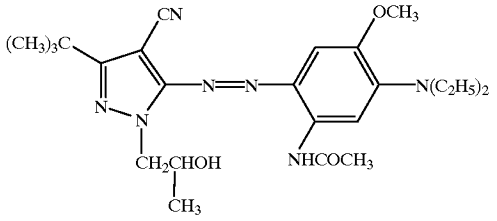

Magenta Dye D

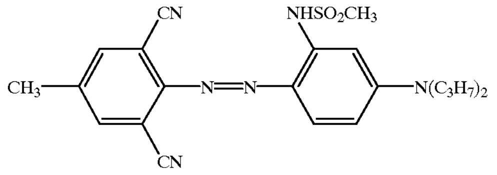

Magenta Dye E

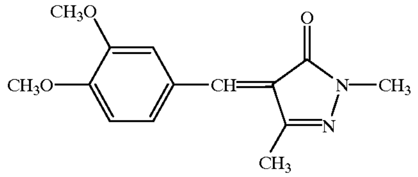

Yellow Dye F

Control Magenta Dye-Donor Element 6

On a 100 μm poly(ethylene terephthalate) support was coated a dye layer containing Magenta Dye D illustrated above, 0.057 g/$m^2$; Magenta Dye E illustrated above, 0.032 g/$m^2$; Yellow Dye F illustrated above, 0.0098 g/$m^2$; and Cyanine Dye C, 0.027 g/$m^2$, in a cellulose acetate propionate binder (CAP 480-20 from Eastman Chemical Company), 0.16 g/$m^2$, from a solvent mixture of diethyl ketone and 1-methoxy-2-propanol (55/45 wt./wt).

Element 7 of the Invention

This element was the same as Control 6 except that the amount of CAP was 0.106 g/$m^2$ and the coating contained stabilizer phenoxy resin PKHH, 0.053 g/$m^2$.

The above elements were tested as in Example 2. The following results were obtained:

TABLE 3

| Element | % Loss |
|---|---|
| Control 6 | 52 |
| 7 | 25 |

The above results show that the Element 7 containing the stabilizer used in the invention had a lower % of dye loss than the Control Element 6.

Example 4

The following dyes were employed in this example:

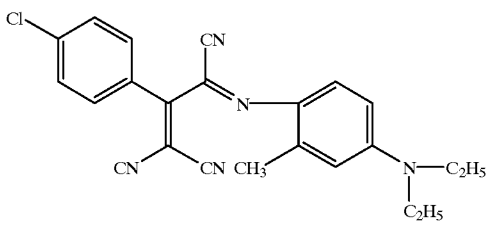

Cyan Dye G

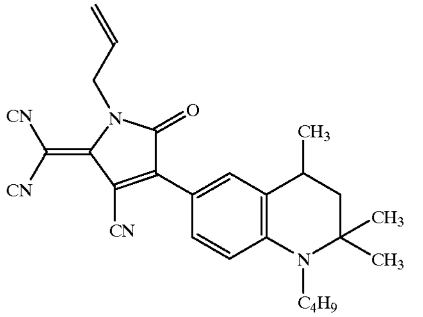

Cyan Dye H

Control Cyan Dye-Donor Element 7

On a 100 μm poly(ethylene terephthalate) support was coated a dye layer containing Cyan Dye G illustrated above, 0.024 g/$m^2$; Cyan Dye H illustrated above, 0.056 g/$m^2$; and Cyanine Dye C, 0.027 g/$m^2$; in a cellulose acetate propionate binder (CAP 480-20 from Eastman Chemical Company), 0.16 g/$m^2$, from a solvent mixture of diethyl ketone and 1-methoxy-2-propanol (55/45 wt./wt).

Element 8 of the Invention

This element was the same as Control 7 except that the amount of CAP was 0.106 g/$m^2$ and the coating contained stabilizer phenoxy resin PKHH, 0.053 g/$m^2$.

The above elements were tested as in Example 2. The following results were obtained:

TABLE 4

| Element | % Loss |
|---|---|
| Control 7 | 35 |
| 8 | 21 |

The above results show that the Element 8 containing the stabilizer used in the invention had a lower % of dye loss than the Control Element 7.

The invention has been described in detail with particular reference to preferred embodiments thereof, but it will be understood that variations and modifications can be effected within the spirit and scope of the invention.

What is claimed is:

1. A colorant-donor element for laser thermal transfer comprising a support having thereon a colorant layer comprising a colorant dispersed in a binder, said colorant layer having associated therewith an infrared-absorbing cyanine colorant having at least two sulfonic acid groups, said cyanine colorant having the following formula:

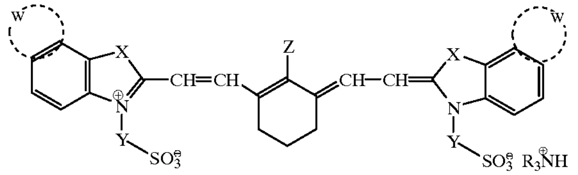

wherein:

each W independently represents the atoms necessary to form an optional 6-membered aromatic ring;

each X independently represents sulfur or $C(CH_3)_2$;

each Y independently represents an alkylene group having from about 2 to about 5 carbon atoms:

Z is chlorine or an alkylsulfonyl group having from 1 to about 4 carbon atoms; and each R independently represents an alkyl group having from 1 to about 6 carbon atoms; and said colorant layer also containing a stabilizer comprising a phenoxy resin, a copolymer of vinyl chloride/vinyl acetate/maleic anhydride or a copolymer of styrene/4-vinylpyridine.

2. The element of claim 1 wherein said stabilizer is present in an amount of from about 0.02 g/$m^2$ to about 0.1 g/$m^2$.

3. The element of claim 1 wherein said stabilizer is a phenoxy resin.

4. The element of claim 1 wherein X is $C(CH_3)_2$.

5. The element of claim 1 wherein Y is $(CH_2)_3$.

6. The element of claim 1 wherein Z is chlorine.

7. The element of claim 1 wherein Z is methylsulfonyl.

8. The element of claim 1 wherein R is n-butyl.

9. The element of claim 1 wherein said colorant is a dye.

10. The element of claim 1 wherein said colorant is a pigment.

11. A process of forming a laser thermal transfer image comprising imagewise-heating by means of a laser a colorant-donor element comprising a support having thereon a colorant layer comprising a colorant dispersed in a polymeric binder and transferring a colorant image to a colorant-receiving element to form said colorant transfer image, wherein said colorant layer has associated therewith an infrared-absorbing cyanine colorant having at least two sulfonic acid groups, said cyanine colorant having the following formula:

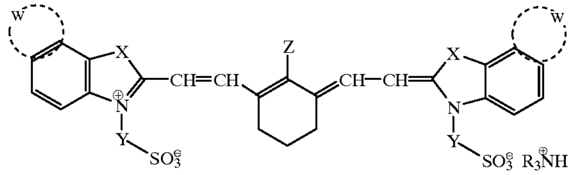

wherein:

each W independently represents the atoms necessary to form an optional 6-membered aromatic ring;

each X independently represents sulfur or $C(CH_3)_2$;

each Y independently represents an alkylene group having from about 2 to about 5 carbon atoms;

Z is chlorine or an alkylsulfonyl group having from 1 to about 4 carbon atoms; and each R independently represents an alkyl group having from 1 to about 6 carbon atoms; and said colorant layer also containing a stabilizer comprising a phenoxy resin, a copolymer of vinyl chloride/vinyl acetate/maleic anhydride or a copolymer of styrene/4-vinylpyridine.

12. The process of claim 11 wherein said stabilizer is present in an amount of from about 0.02 $g/m^2$ to about 0.1 $g/m^2$.

13. The process of claim 11 wherein said stabilizer is a phenoxy resin.

14. The process of claim 11 wherein X is $C(CH_3)_2$, Y is $(CH_2)_3$ and Z is chlorine or methylsulfonyl.

15. The process of claim 11 wherein R is n-butyl.

16. A laser thermal transfer assemblage comprising:

a) a colorant-donor element comprising a support having thereon a colorant layer comprising a colorant dispersed in a polymeric binder, and b) a colorant-receiving element comprising a support having thereon a colorant image-receiving layer, said colorant-receiving element being in a superposed relationship with said colorant-donor element so that said colorant layer is in contact with said colorant image-receiving layer, wherein said colorant layer has associated therewith an infrared-absorbing cyanine colorant having at least two sulfonic acid groups, said cyanine colorant having following formula:

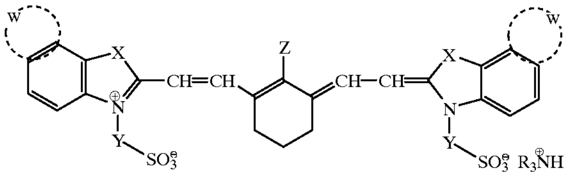

wherein:

each W independently represents the atoms necessary to form an optional 6-membered aromatic ring;

each X independently represents sulfur or $C(CH_3)_2$;

each Y independently represents an alkylene group having from about 2 to about 5 carbon atoms;

Z is chlorine or an alkylsulfonyl group having from 1 to about 4 carbon atoms; and each R independently represents an alkyl group having from 1 to about 6 carbon atoms; and said colorant layer also containing a stabilizer comprising a phenoxy resin, a copolymer of vinyl chloride/vinyl acetate/maleic anhydride or a copolymer of styrene/4-vinylpyridine.

17. The assemblage of claim 16 wherein said stabilizer is present in an amount of from about 0.02 $g/m^2$ to about 0.1 $g/m^2$.

18. The assemblage of claim 16 wherein said stabilizer is a phenoxy resin.

19. The assemblage of claim 16 wherein X is $C(CH_3)_2$, Y is $(CH_2)_3$ and Z is chlorine or methylsulfonyl.

20. The assemblage of claim 16 wherein R is n-butyl.

* * * * *